United States Patent [19]

Rodriguez, II et al.

[11] Patent Number: 4,974,317
[45] Date of Patent: Dec. 4, 1990

[54] METHOD OF MAKING FOR RF LINE REPLACABLE MODULES

[75] Inventors: Noe E. Rodriguez, II, Arnold; William T. Flaherty, Jr., Columbia, both of Md.; Sharon A. Duggan, Washington, D.C.; Timothy M. Fertig, Pasadena, Md.

[73] Assignee: Westinghouse Electric Corp., Pittsburgh, Pa.

[21] Appl. No.: 340,633

[22] Filed: Apr. 20, 1989

Related U.S. Application Data

[62] Division of Ser. No. 247,865, Sep. 12, 1988, Pat. No. 4,833,664.

[51] Int. Cl.⁵ ............................................. H05K 3/30
[52] U.S. Cl. ..................................... 29/841; 174/68.5; 357/81
[58] Field of Search ................ 29/830, 841; 174/68.5, 174/16.3; 357/81

[56] References Cited

U.S. PATENT DOCUMENTS

| | | | |
|---|---|---|---|
| 3,686,533 | 8/1972 | Garnier et al. | 357/81 X |
| 4,658,334 | 4/1987 | McSparran et al. | 174/68.5 X |
| 4,659,931 | 4/1987 | Schmitz et al. | 174/68.5 X |
| 4,718,163 | 1/1988 | Berland et al. | 29/832 X |
| 4,739,443 | 4/1988 | Singhdeo | 174/68.5 X |
| 4,748,495 | 5/1988 | Kucharek | 174/68.5 X |

FOREIGN PATENT DOCUMENTS

| | | | |
|---|---|---|---|
| 101447 | 6/1983 | Japan | 357/81 |
| 1439365 | 6/1976 | United Kingdom | 29/832 |

*Primary Examiner*—Carl J. Arbes
*Attorney, Agent, or Firm*—W. G. Sutcliff

[57] ABSTRACT

A thermal heat transfer member is disclosed for use in electronic or microwave systems with particular application to advanced avionic systems. This thermal heat transfer member for line replaceable module (LRM) comprises; a bottom cover, a grid partition bottom means, a solid thermal plane material fixedly interconnected to the grid partition bottom means, a grid partition top means fixedly interconnected upon the thermal plane, sandwiching the thermal plane between the grid partition top and the grid partition bottom, and finally, a top cover. The utilization of a "building block" approach and composite high strength heat-conductive materials designed to dissipate heat away from electronic devices and components mounted within the LRM operate to produce a radio frequency LRM of high heat conductivity with reduced weight ideal for utilization in advanced development avionic systems subject to extreme G-force and stress in avionic system operation.

1 Claim, 2 Drawing Sheets

METHOD OF MAKING FOR RF LINE REPLACABLE MODULES

STATEMENT OF GOVERNMENT INTEREST

This invention was made with Government support under United States Government Contract No. F33657-86-C-2145 awarded by the United States Air Force. The Government has certain rights in this invention.

This application is a Division of Patent Application Ser. No. 07/247,865, now Pat. No. 4,837,669, issued June 6, 1988 filed Sept. 12, 1988, entitled, BUILDING BLOCK COMPOSITE DESIGN AND METHOD OF MAKING FOR RF LINE REPLACEABLE MODULES.

BACKGROUND OF THE INVENTION

1. Field of the Invention

The present invention relates to a design and method of fabrication for an RF line replaceable module (LRM) utilizing a "building block" fabrication approach of composite material moldings for use in future avionic systems.

2. Description of the Prior Art

To date, airborne radio frequency (RF) modules have been composed of aluminum blocks machined to specific internal and external configurations. The weight of the RF module is a critical factor because their applications usually involve advanced avionics where weight of the critical radar components must be maintained to a minimum.

In electronic applications such as airborne or aerospace electronics, specifically radar systems, it is highly desirable to minimize the weight of the thermal transfer means utilized in these systems.

Aluminum is relatively light weight—0.1 lb/in$^3$. However, the defense applications and demand for lightweight avionics require the utilization of composite materials for Standard Electronic Modules (SEM). The thermal integrity of the mounting surfaces of these thermal planes for avionics use must be maintained. Therefore, a molded composite thermal plane of pitch based carbon fiber having unique heat conductive properties would preserve the thermal integrity of the mounting surfaces without undue weight. A weight reduction of potentially thirty-five percent could be expected per unit.

The problem to be solved then is the design and fabrication of an RF line replaceable module or standard electronic module having extremely light weight while maintaining thermal integrity.

The trend for the next generation of LRMs is to continue minimizing weight and unit costs. It is therefore important to think in terms of standardizing composite moldings and specializing only in those portions requiring specific designs. The concept as addressed by this invention implements an RF module having three standard composite moldings which significantly reduces material weight, improves thermal performance, as well as overall unit cost.

It is standard practice in existing electronic systems to utilize as a thermal transfer means a conductive thermal plane with printed circuit boards mounted upon it. The printed circuit boards are mounted with heat generating electronic components which require heat dissipation. Such heat dissipation via a conductive thermal plane makes use of plates of aluminum or copper having one or more printed circuit boards mounted upon it. The thermal plane interfaces with a heat sink contacting and conducing heat to the edges of the thermal plane.

A thermal transfer means as seen in U.S. Pat. No. 4,602,678, entitled "Interfacing of Heat Sinks With Electrical Devices And The Like," issued July 29 1986 to inventor Herbert J. Fick, is described as a silicon layer with embedded thermally conductive metal oxides.

In a recently issued patent, U.S. Pat. No. 4,730,232 entitled "High Density Microelectronic Packaging Module for High Speed Chips", as owned by the assignee of the present invention, an aluminum thermal plane for cooling printed circuit board attachments as positioned on opposing sides of the thermal plane in a standard electronic module is described.

Further, the utilization of composite heat transfer material such as P-100, a pitch based carbon fiber in a matrix such as an epoxy as seen in issued U.S. Pat. No. 4,849,858 entitled "Composite Heat Transfer Means" is known in the art. This patent, owned by the assignee of the present invention, describes a thermal heat transfer member comprising a planar composite utilizing thermally conductive graphite fibers disposed within a matrix material. That invention, "Composite Heat Transfer Means", was usable in a variety of applications ranging from the SEM embodiment with a composite heat transfer member bonded between circuit board laminates, to a more generic thermal plane electronic application for use as a heat transfer member wherein one part of an electronic chassis or RF module.

SUMMARY OF THE INVENTION

In accordance with the above-stated requirements of the present invention, a composite design and method of making same for RF line replaceable modules (LRM's) suitable for use in advanced development avionic systems is described.

The LRM comprises three standard composite molds: a cover, at least two "eggcrate" grid partition means, and a composite material heat conductive thermal plane The method of making this RF module as described utilizes molded parts, wherein portions of the "eggcrate" grid partitions not needed for electromagnetic interference shielding are machined away from the grids on both sides. Bonding of the eggcrate grid materials to the thermal plane on each side of the plane can be achieved by adhesive bonding or mechanical bonding prior to the mechanical attachment of the top and bottom covers. Radio frequency, open or hermetically sealed, circuit components are mounted upon the composite material heat conductive thermal plane The final attachment of the top and bottom covers utilizes standard hardware.

This composite design utilizing a "building block" concept is unique in its approach to fabrication of RF modules using standard composite molds results in an extremely lightweight line-replaceable module (LRM).

The key features and advantages to this disclosed device are; the lightweight chassis and covers replacing aluminum with reinforced plastic material, minimal machining by maximization of standard molds, high heat conductivity composite material thermal planes, low cost per module through the optimization of composite selection and location, and finally, design time minimization through the creation of customized designs using the simple standard "building blocks".

BRIEF DESCRIPTION OF THE DRAWINGS

For a better understanding of the invention, reference may be had to the preferred embodiments exemplary of the invention shown in the accompanying drawings in which.

DESCRIPTION OF THE PREFERRED EMBODIMENTS

Figure 1:
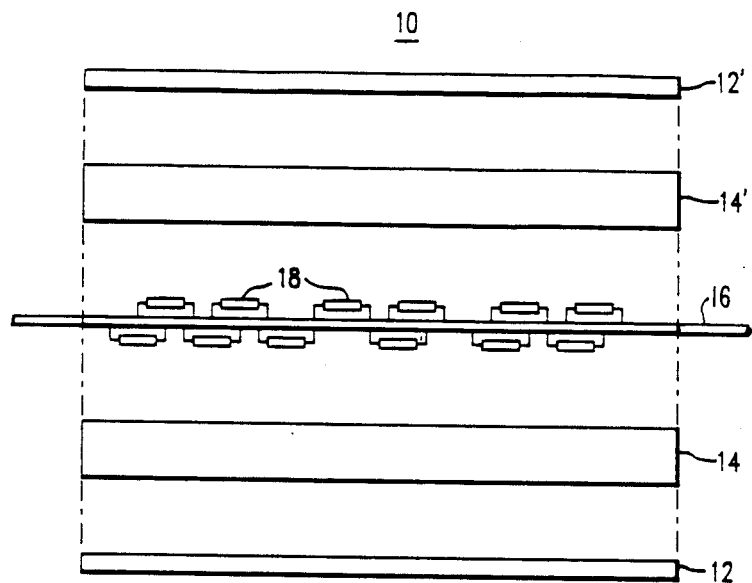
FIG. 1 is a side view of a composite RF module.

FIG. 1 is a side view of the composite RF module 10. This composite RF module 10 comprises a bottom cover 12, which is fixably mounted to a grid partition bottom member 14. Both the bottom cover 12 and grid partition bottom member 14 are reinforced plastic in epoxy. Thermal plane 16 rests upon the grid partition bottom 14. Thermal plane 16 would be made of a highly conductive composite material—for example, P-100 in epoxy. A grid partition top 14', also composed of a reinforced plastic material is mounted by adhesive or mechanical means to the highly conductive thermal plane 16. This thermal plane 16 is effectively "sandwiched" between the composite material grid partition top 14' and the composite material grid partition bottom 14. As shown in FIG. 1, a multiplicity of RF circuit components 18 are mounted upon both sides of the thermal plane 16. Finally, a top cover 12' also a lightweight composite is mechanically interconnected to the grid partition top 14', and the building block construction of the composite model 10 is complete.

Figure 1A:
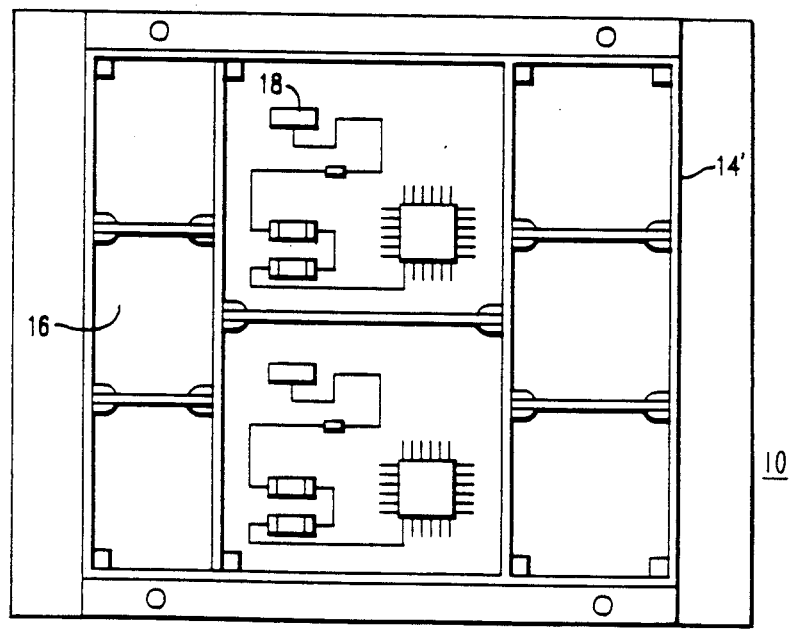
FIG. 1A is a top plan view with cover removed of the composite RF module.
Figure 2:
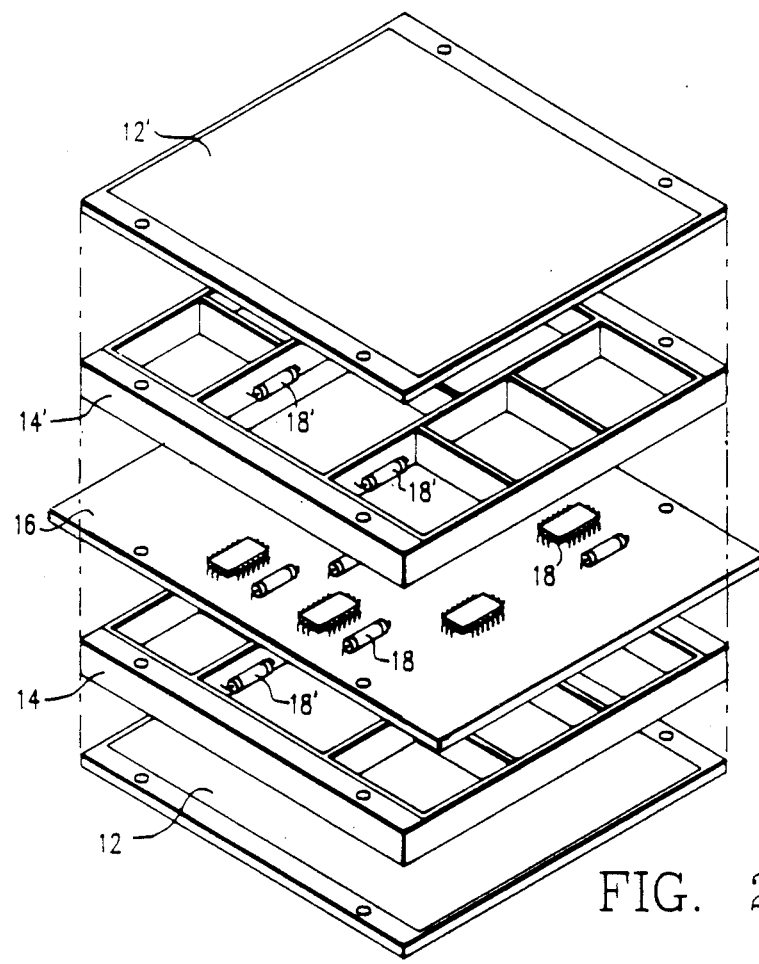
FIG. 2 is an exploded orthogonal view of the "building blocks" utilized in the fabrication of the composite RF module.

FIG. 1A is a top plan view of the composite RF module as shown in FIG. 1. In FIG. 1A, the lightweight composite top cover 12' is removed to show in detail the "eggcrate" grid partition concept. "Eggcrate" grid partition top 14' has thermal plane 16 fixedly connected to, and beneath the grid partition top 14'. RF components 18 can be seen mounted between individual sections of the "eggcrate" grid partition top 14'. Heat produced by these RF components 18 is conducted from the interior of the thermal plane to the exterior of the thermal plane by the highly conductive thermal plane composite material FIG. 2 is an exploded, orthogonal view of the composite RF module demonstrating the various interconnected composite mold sections. Again, the bottom cover 12 is designed to be rigidly mounted either adhesively or mechanically to the "eggcrate" grid partition bottom 14 which, may be fabricated of either man-made or natural composite material. As shown in FIG. 2, if this "egg crate" grid partition bottom 14 is fabricated of heat conductive material, like the thermal plane 16, then RF components 18" and other circuitry could be mounted to the sides of the grid partition bottom 14. This composite material is hollowed out and tooled, providing an SEM having the lightest weight with greatest strength The thermal plane 16 can be seen thermally conducting heat away from the mounted radio frequency components 18 while the "eggcrate" grid partition top 14', provides added stability, strength, and electrical isolation. Not unlike the grid partition bottom 14, the grid partition top 14' fabricated of heat conductive composite material could support RF components 18". Finally, the top cover 12' can be seen completing this "building block" construction for a composite RF module.

Figure 3:
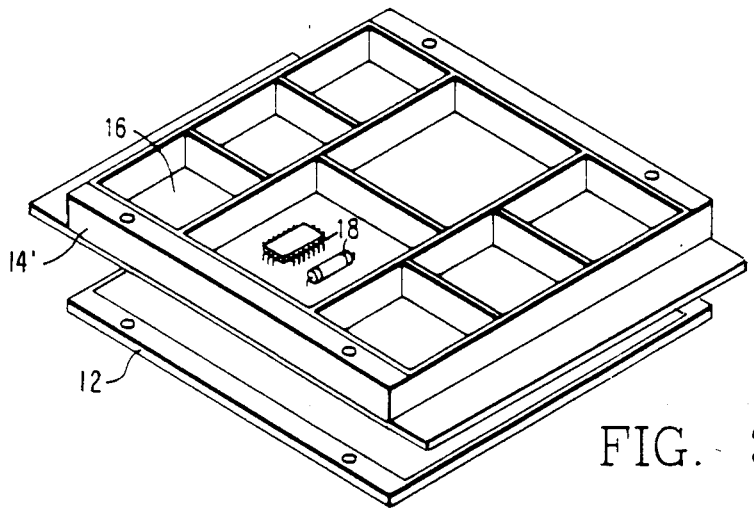
FIG. 3 is an orthogonal view of the preferred embodiment a composite RF, LRM module.

FIG. 3 is an orthogonal view of the preferred embodiment a composite, radio frequency, LRM module. The bottom composite cover 12 designed to be rigidly mounted to the "eggcrate" partition bottom 14, is of a composite material which can be conducting or non-conducting. The "eggcrate" partition bottom 14 is also comprised of a composite material, for examples, carbon fiber in an epoxy matrix. A multiplicity of RF components 18 are fixedly mounted upon the heat conductive thermal plane 16. The thermal plane 16 comprises a pitch based carbon fiber wherein all the fibers run in the same direction such as, P-100 or P-120, an AMOCO Performance Product, for example.

Numerous variations may be made in the above-described combination and different embodiments of this invention may be made without departing from the spirit thereof. Therefore, it is intended that all matter contained in the foregoing description and the accompanying drawing shall be interpreted as illustrative and not in a limiting sense.

We claim:

1. A method of fabricating a line replaceable electronic module, said module having a multiplicity of electronic components, connectors and interfaces, first and second standard planar grids, at least one heat conductive composite planar thermal means operable to dissipate heat, and top and bottom composite covers, said method of fabricating, comprising the steps of:

a. molding, using standard molds, said first and said second standard composite planar grids, said first and said second standard composite planar grids having at least two sides;

b. machining, said two sides of said first and said second standard composite planar grids a predetermined amount, removing said composite material not required for said line replaceable module electromagnetic interference shielding;

c. bonding, said first and said second standard composite planar grids to said heat conductive composite planar thermal means, said first standard composite planar grid on one side of said heat conductive composite thermal plane and said second standard composite planar grid on the opposing side of said heat conductive planar thermal means;

d. plating, said first and said second standard composite planar grid and said heat conductive composite planar thermal means, and top and bottom composite covers with a conductive material;

e. mounting, a multiplicity of components, connectors and interfaces upon said heat conductive composite planar thermal means; and f. attaching, said top and said bottom covers to said first and said second standard composite planar grids utilizing standard hardware.

* * * * *